United States Patent
Chin et al.

(10) Patent No.: US 8,826,057 B1
(45) Date of Patent: Sep. 2, 2014

(54) MULTIPLE TIME DOMAIN SYNCHRONIZER CIRCUITS

(75) Inventors: Bruce Lorenz Chin, Decatur, GA (US); David Stuart Gibson, Suwanee, GA (US)

(73) Assignee: Integrated Device Technology Inc., San Jose, CA (US)

( * ) Notice: Subject to any disclaimer, the term of this patent is extended or adjusted under 35 U.S.C. 154(b) by 198 days.

(21) Appl. No.: 13/538,643

(22) Filed: Jun. 29, 2012

Related U.S. Application Data (63) Continuation-in-part of application No. 13/436,324, filed on Mar. 30, 2012.

(51) Int. Cl.
  *G06F 1/12* (2006.01)
  *G06F 13/42* (2006.01)
  *H04L 5/00* (2006.01)

(52) U.S. Cl.
  USPC ............... 713/400; 713/401; 710/60; 710/61

(58) Field of Classification Search
  USPC .............................. 713/400, 401; 710/60, 61
  See application file for complete search history.

(56) References Cited

U.S. PATENT DOCUMENTS

| | | | |
|---|---|---|---|
| 6,396,322 B1 | 5/2002 | Kim et al. | |
| 7,134,035 B2 | 11/2006 | Sharma et al. | |
| 7,161,999 B2 | 1/2007 | Parikh | |
| 7,385,861 B1* | 6/2008 | Zhu | 365/194 |
| 7,665,059 B2 | 2/2010 | Czeck et al. | |
| 7,782,992 B2 | 8/2010 | Nagarajan | |
| 7,904,859 B2 | 3/2011 | Maixner et al. | |
| 7,928,770 B1* | 4/2011 | Bellis et al. | 326/96 |
| 8,027,420 B2 | 9/2011 | McCabe | |
| 8,205,110 B2 | 6/2012 | Petrick | |
| 8,601,231 B2 | 12/2013 | Mes | |
| 8,631,220 B2 | 1/2014 | Smith et al. | |
| 2002/0130795 A1* | 9/2002 | Moon | 341/61 |
| 2007/0058478 A1* | 3/2007 | Murayama | 365/233 |
| 2007/0064846 A1* | 3/2007 | Angel et al. | 375/354 |
| 2010/0073060 A1* | 3/2010 | Nguyen | 327/255 |
| 2011/0175654 A1* | 7/2011 | Lee | 327/158 |

* cited by examiner

*Primary Examiner* — Vincent Tran
(74) *Attorney, Agent, or Firm* — Myers Bigel, et al.

(57) ABSTRACT

A multiple time domain synchronizer includes a data pipeline containing a plurality of serially-connected delay elements therein. A latency selection circuit is provided, which has a plurality of inputs electrically coupled to outputs of a corresponding plurality of delay elements in the data pipeline. The latency selection circuit is configured to pass a data pipeline signal from an output of a selected one of the plurality of delay elements in response to a latency control signal. A synchronization circuit is provided, which is electrically coupled to an output of the latency selection circuit. This synchronization circuit, which includes first and second unequal timing paths therein, is responsive to a clock that synchronizes capture of the data pipeline signal selected by the latency selection circuit and a destination code that selects one of the first and second unequal timing paths to be traversed by the captured data pipeline signal as active.

18 Claims, 5 Drawing Sheets

MULTIPLE TIME DOMAIN SYNCHRONIZER CIRCUITS

CROSS-REFERENCE TO RELATED APPLICATION

This application is a continuation-in-part of commonly-assigned U.S. application Ser. No. 13/436,324, filed Mar. 30, 2012, the disclosure of which is hereby incorporated by reference.

FIELD OF THE INVENTION

The present invention relates to integrated circuit devices and, more particularly, to integrated circuit devices used to control timing of data and control signals between source and target devices.

BACKGROUND OF THE INVENTION

In conventional memory buffers, such as DDR3-compatible memory buffers, write and read commands may be spaced a minimum of four cycles apart while the data associated with these commands may be delayed as many as 40 cycles. The command and accompanying control data such as burst length and training parameters must therefore be delayed a corresponding amount of time. One conventional technique to delay command and control data is to use respective pipelines for the signals being delayed. Unfortunately, the use of such pipelines to control the timing of a relatively large number of signals may require an excessive amount of layout area to implement and may not efficiently support variable timing that may be command specific. Moreover, in some memory buffer designs, relatively slower signals are frequently generated in response to relatively faster signals, which can be a problem when the timing of the relatively faster signals is changed. Accordingly, it would be advantageous to provide a greater degree of independent control between signals having different timing requirements. Moreover, on the DDR-compatible memory buffer, register-transfer level (RTL) circuitry controls custom logic operating at the same frequency but at varying clock phases and must pass control information with minimum latency so that low read and write latencies of the DDR3 specification can be supported.

SUMMARY OF THE INVENTION

A multiple time domain synchronizer according to some embodiments of the invention can include first and second serially-connected registers. The first register is configured to latch a first signal in-sync with a first clock, which is associated with a first time domain, and the second register is configured to latch a second signal generated by an output of the first register in-sync with a second clock, which is phase-delayed relative to the first clock. A latency selection circuit is also provided, which has a first input configured to receive a register output signal derived from the first register and a second input configured to receive a register output signal from the second register. The latency selection circuit is configured to selectively pass one of the register output signals at the first and second inputs to an output thereof in response to a latency control signal. A synchronization circuit is also provided, which is electrically coupled to an output of the latency selection circuit. The synchronization circuit, which includes first and second unequal timing paths therein, is responsive to a third clock that synchronizes capture of a register output signal selected by the latency selection circuit and is responsive to a destination code that selects, as active, one of the first and second unequal timing paths to be traversed by the captured register output signal.

According to still further embodiments of the invention, the synchronization circuit may include a destination register, which is configured to latch a signal derived from the traversal of the captured register output signal along the active one of the first and second unequal timing paths. This destination register may be responsive to a fourth clock, which is associated with a second time domain that is phase-asynchronous relative to the first time domain.

According to still further embodiments of the invention, a core clock generator may be provided, which is configured to generate a core clock. First and second insertion delay devices may also be provided, which are configured to provide the first clock as a first delayed version of the core clock and the second clock as a second delayed version of the core clock, respectively. A data delay device may also be provided, which is electrically coupled between the output of the first register and an input of the second register. According to preferred aspects of these embodiments of the invention, to achieve proper timing a period of the core clock minus a setup time of the second register minus a delay provided by the data delay device minus a difference between a delay provided by the first insertion delay device and a delay provided by the second insertion delay device is greater than zero. Moreover, the first, second and third clocks may be provided in-sync with the core clock.

According to still further embodiments of the invention, the first and second inputs of the latency selection circuit may be electrically coupled to the input and an output of the second register, respectively. This latency selection circuit may be provided as a first multiplexer having a control terminal responsive to the latency control signal. In addition, the first timing path may include a level sensitive latch, which has an enable terminal responsive to an inverted version of the third clock, and the second timing path may include an output register having a clock terminal responsive to the third clock. A data input of the level sensitive latch and a data input of the output register may be electrically coupled together. The synchronization circuit may further include a second multiplexer having a control terminal responsive to the destination code, a first input electrically coupled to an output of the level sensitive latch and a second input electrically coupled to an output of the output register.

A multiple time domain synchronizer according to further embodiments of the invention includes a data pipeline containing a plurality of serially-connected delay elements therein, which are responsive to respective clocks including at least first and second clocks that are out-of-phase relative to each other in a first time domain. A latency selection circuit is provided, which has a plurality of inputs electrically coupled to outputs of a corresponding plurality of delay elements in the data pipeline. The latency selection circuit is configured to pass a data pipeline signal from an output of a selected one of the plurality of delay elements in response to a latency control signal. A synchronization circuit is provided, which is electrically coupled to an output of the latency selection circuit. The synchronization circuit, which includes first and second unequal timing paths therein, is responsive to a third clock that synchronizes capture of the data pipeline signal selected by the latency selection circuit and a destination code that selects one of the first and second unequal timing paths to be traversed by the captured data pipeline signal as active.

The synchronization circuit may also include a destination register, which is configured to latch a signal derived from the traversal of the captured data pipeline signal along the active one of the first and second unequal timing paths. This destination register may be responsive to a fourth clock that is associated with a second time domain that is phase-asynchronous relative to the first time domain. The latency selection circuit may include a first multiplexer having a control terminal responsive to the latency control signal. The first timing path may include a level sensitive latch, which has an enable terminal responsive to an inverted version of the third clock. The second timing path may include an output register having a clock terminal responsive to the third clock. A data input of the level sensitive latch and a data input of the output register may be electrically coupled together. The synchronization circuit may include a second multiplexer having a control terminal responsive to the destination code, a first input electrically coupled to an output of the level sensitive latch and a second input electrically coupled to an output of the output register.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
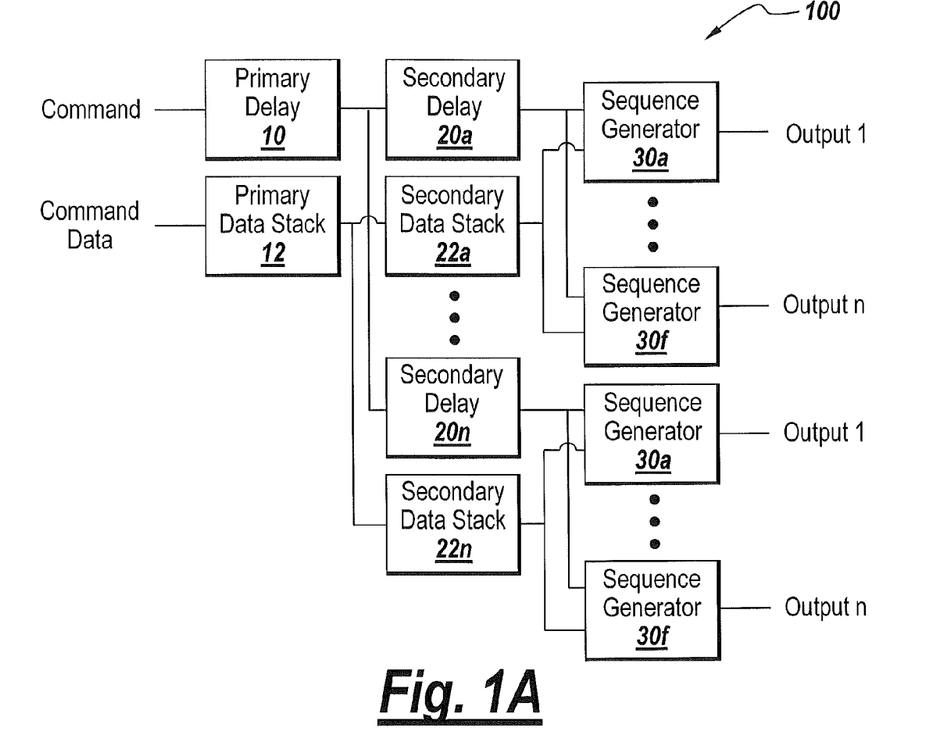
FIG. 1A is a block diagram of a timing controller according to some embodiments of the invention.

Embodiments of the invention will now be described with respect to FIGS. 1A-1B. As shown by FIG. 1A, a timing controller 100 within a memory buffer can include a pipelined delay chain configured to process commands and control signals, which are associated with writing and reading data to and from a plurality of memory devices coupled to the controller 100. These memory devices may be dynamic random access memory (DRAM) devices arrayed on a dual in-line memory module (DIMM) or board, for example. The pipelined delay chain is shown as including a cascaded arrangement of a primary delay chain 10, 12 at least one secondary delay chain (20a, . . . , 20n; 22a, . . . , 22n) and a plurality of control signal sequence generators (30a, . . . , 30f) responsive to signals generated by the at least one secondary delay chain. The primary delay chain may be configured as a plurality of serially-linked registers 10, which are configured to support a pipeline of read/write commands, and a stack 12 (e.g., FIFO) configured to support operations to push and pop control signals associated with the read/write commands to and from the stack 12. As will be understood by those skilled in the art, a command may either be a write command (W) having a corresponding write latency (WL) or a read command (R) having a corresponding read latency (RL). Accompanying each command may be an indication of a burst length, which may be expressed as a single bit to designate either a first burst length (e.g., 4) or a second burst length (e.g., 8). Also accompanying each command may be a designation of the rank of a memory (e.g., DRAM) being accessed in response to the command, which may be a function of, among other things, the location of a memory device on a module or board. As will be understood by those skilled in the art, each memory rank may have unique read and write timing parameters that are used to control a receiver sequence associated with a memory read command or a transmitter sequence associated with a memory write command. These timing parameters may have a coarse component, which may be expressed in clock cycles, and a fine component, which may be expressed in fractions (e.g., 64ths) of a clock cycle.

When the controller 100 is used within a memory buffer, the timing may be controlled on four interfaces: host upper nibble (HUN), host lower nibble (HLN), DRAM upper nibble (DUN) and DRAM lower nibble (DLN). Each of these four interfaces may have a unique set of two timing parameters (e.g., one set to control the DQ pins and one set to control the DQS/DQS# pins). According to some embodiments of the invention, the primary delay stage 10 receives the command (R or W) into a delay element, which may provide a delay equivalent to either RL-n or WL-n, where "n" is an integer (e.g., n=5), RL is a read latency associated with a read command and WL is a write latency associated with a write command. In particular, the delay provided by the primary delay stage 10 may be set to a value that allows for preparatory actions to be undertaken in response to the commands. At the same time that the command enters a primary delay element, the command type (R or W), burst length and rank information are stored in a stack 12, which may be configured as a W-bit wide and D-words deep shift register, which supports push, pop and clear functions in a first-in first-out manner.

When the command exits the delay element, the command type, burst length and rank information are popped off the stack 12 and provided to an appropriate secondary stack (22a-22n). The command type and rank information are then used to access the timing parameters for the four interfaces under control (i.e., host upper and lower nibbles and DRAM upper and lower nibbles). The secondary delay stage 20a-20n then receives the command and delays it according to the coarse delay in the timing parameters. According to some embodiments of the invention, there can be 14 secondary delay stages, however a reduced number of programmable delay stages with multiple taps can be used as explained more fully hereinbelow. For example, the secondary delay stages 20a-20n can include four (4) for a lower nibble read controller (input clock, input data, output clock and output data delay stages) and four (4) for an upper nibble read controller and a reduced number of three (3) for a lower nibble write controller and three (3) for an upper nibble write controller, because the DQ and DQS pins can have the same timing during write operations. Advantageously, by sharing the first primary delay stage 10 among all 14 secondary delay stages 20a-20n, 13·N registers can be saved, where N is the length of the primary delay stage. The third stage includes sequence generators 30a-30f, which generate control signals of an appropriate delay and duration to operate the interfaces (e.g., DDR interfaces). Moreover, by sharing the first two stages among multiple sequence generators, more substantial reductions in the number of required registers can be achieved.

Figure 1B:
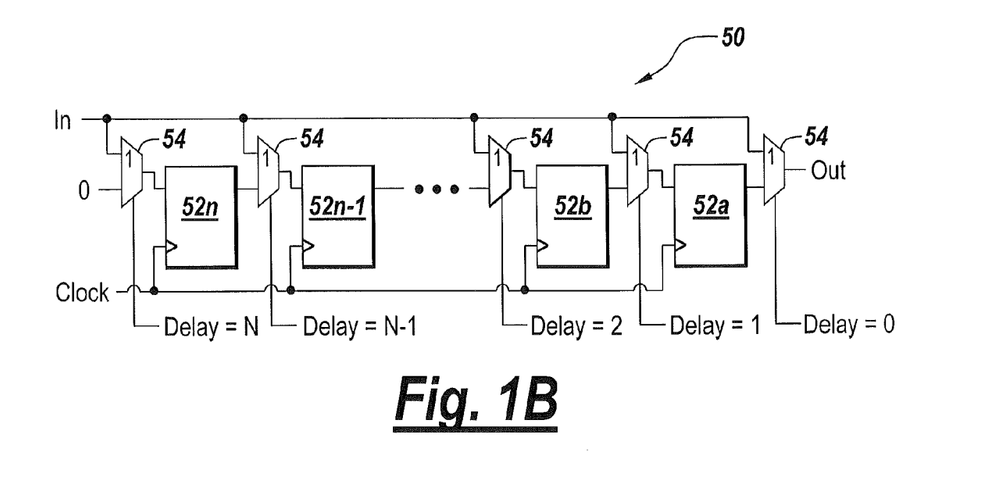
FIG. 1B is a block diagram of a pipeline containing serially-linked registers (e.g., D-type flip flops) that may be used in the timing controller of FIG. 1A.

As illustrated by FIG. 1B, a delay stage may be embodied as a pipeline 50 containing serially-linked registers 52a-52n (e.g., D-type flip flops) with a fixed output register and a variable input register controlled by multiplexers 54. In response to each clock, data moves from one register in the pipeline 50 to a subsequent register until it appears at an output where it is either acted upon or passed to another delay element. As illustrated, each register may take its input from the previous stage in the pipeline 50 or the primary input (IN) of the delay element. As will be understood by those skilled in the art, if the delay required is N clock cycles, the Nth pipeline register from the output can be used to capture an input command. However, if N is 0, the output itself becomes the input to the delay chain and the delay chain is bypassed. A stack within the embodiment of FIG. 1A may be embodied as a shift register W bits wide and D words deep, which may support push, pop and clear operations in a first-in first-out manner.

Figure 2A:
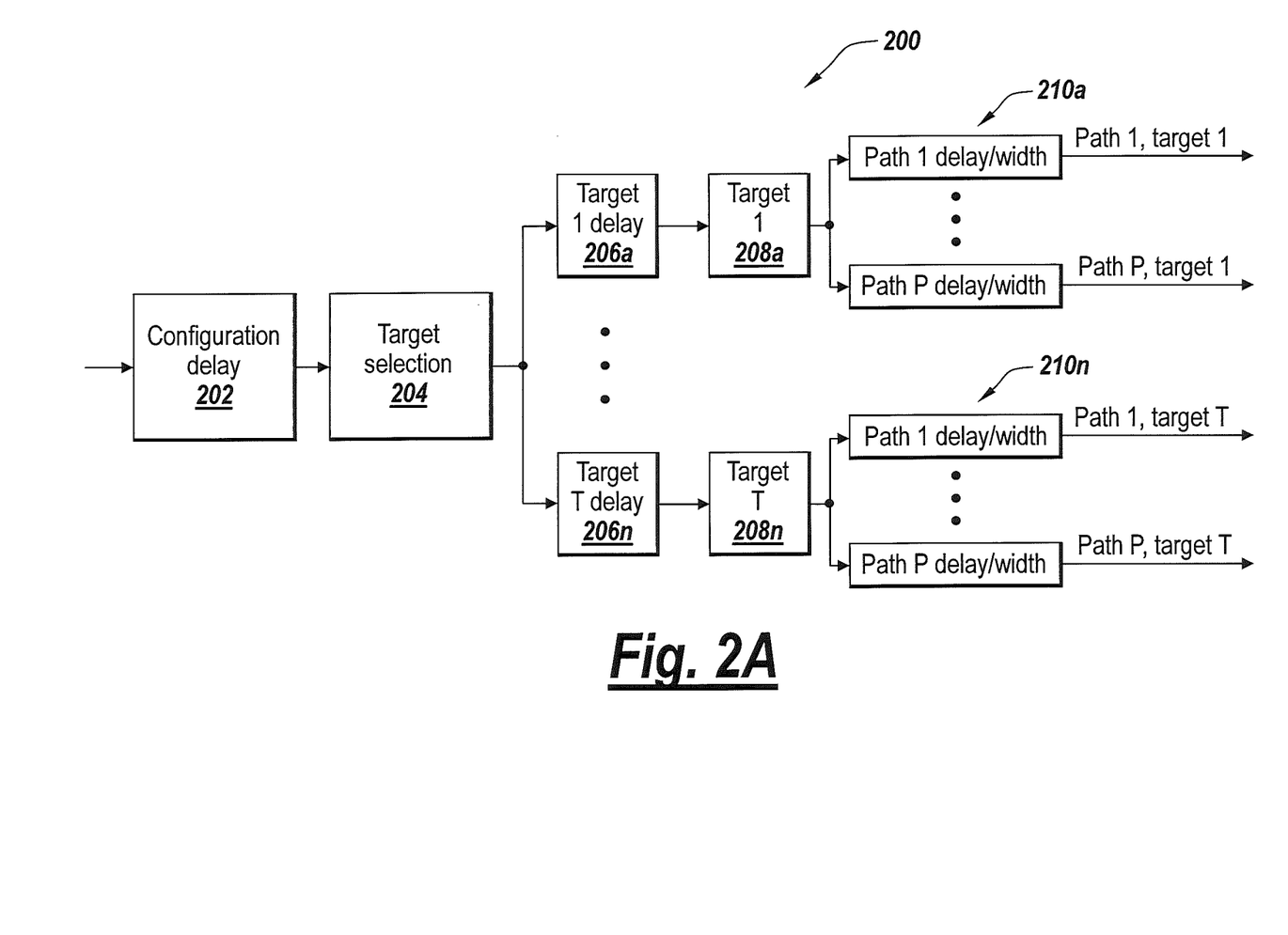
FIG. 2A is a block diagram of a timing controller and pipelined signal generator according to embodiments of the invention.

FIG. 2A illustrates a timing controller and pipelined signal generator 200 according to additional embodiments of the invention. As shown by FIG. 2A, a timing controller 200 can include a pipeline containing configuration, target and path specific delay elements. The configuration delay element and stack 202 and target selection circuitry 204 may provide a programmable primary delay to received commands and accompanying control signals based on a selected configuration between a source device (e.g., host controller) and a desired target device (e.g., DRAM device 1, . . . , T). A plurality of target specific delay elements 206a-206n are provided as secondary delay elements, which may provide programmable delays to command and control signals received from the primary delay chain. Target specific blocks 208a-208n receive an input timing signal(s) and initiate the generation of signals that comprise the plurality of distinct path signals. These target specific blocks 208a-208n may contain respective secondary data stacks, as illustrated by FIG. 1A, and may use the path-specific information contained in the stacks or recovered from previously stored tables using indicators contained in the stacks to initiate generation of respective path signal(s) (Path 1, . . . , P) having appropriate delays and pulse widths via the path/target specific sequence generators 210a-210n.

Figure 2B:
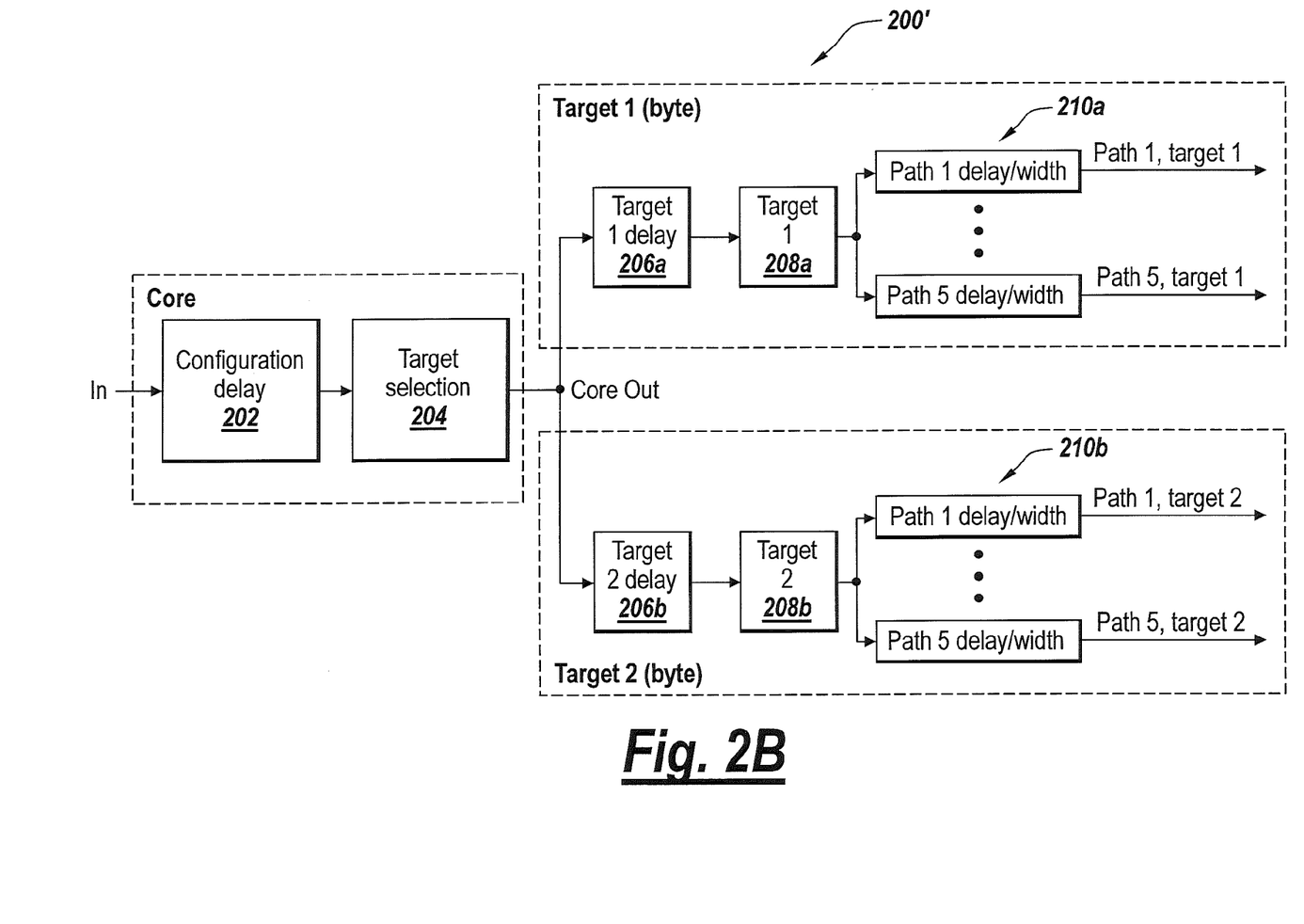
FIG. 2B is a block diagram of a timing controller and pipelined signal generator according to embodiments of the invention.

FIG. 2B illustrates an exemplary timing controller and pipelined signal generator 200' under conditions where the total delays from the input (IN) to Path X, target 1 are (6,6,7,6,7) clock cycles and the total delays from the input (IN) to Path X, target 2 are (12,11,12,12,11). This example illustrates an absolute delay variance from 6 to 12 across the two targets (e.g., two memory devices of unequal rank), but with a delay variance of only one (1) between the control signals for a given target. Accordingly, if a primary delay of 3 is provided, secondary delays of (3,3,4,3,4) and (9,8,9,9,8) will be needed. However, if three additional cycles of secondary delay are pulled into the programmable primary delay, secondary delays of only (0,0,1,0,1) and (6,5,6,6,5) will be needed. This pulls three registers out of the secondary delay path (which is replicated 5 times) and puts them into the primary delay patent (which is replicated only once), thereby reducing the total number of necessary delay stages from 3(1)+9(5*2)=93 to 3(1)+3(1)+6(5*2)=66, which can be achieved merely by reapportioning of delay between the primary and secondary delay elements based on training results. Referring again to FIG. 2A, the above numerical example illustrates that whenever all target delays are greater than X, the delay of X may be substracted from every target delay and added to the configuration delay. Similarly, if all path delays associated with a target are greater than X, then the delay of X may be subtracted from every path delay and added to the target delay. Finally, if the path and target delays are all greater than X, then the delay of X may be subtracted from some combination of path and target delays and added to the configuration delay.

According to still further embodiments of the invention, the embodiments of FIGS. 1A-1B and 2A-2B may be replaced by a "long" shift register (LSR) containing a primary shift register (PSR) cascaded with a secondary shift register (SSR). According to these embodiments, a division in delay between the PSR and SSR may be changed dynamically by providing a signal to an input port of the PSR and tapping different output ports within the LSR. This providing of a signal (e.g., command) to the input port may be performed concurrently with the loading of control information onto a primary data stack (see, e.g., FIG. 1A). This control information tells the design, among other things, how long the PSR should be for a corresponding operation and also configures the design to monitor a particular shift register port to identify when the command is passing from the PSR to the SSR. When the command reaches the SSR, the appropriate delay values for command can be used to program a demultiplexer (DEMUX) to identify which tap is to be selected as the path output. This programmed DEMUX configuration can remain until the next command reaches the end of its PSR and changes the DEMUX settings. This DEMUX program information may be stored in the equivalent of the secondary data stack. One implementation of this has each DEMUX replacing each target branch (see, e.g., FIG. 2A). Of course, the input signals must be spaced sufficiently to insure that all signals generated by a single command have been transmitted before the next command exits the PSR and reprograms the DEMUX. Alternatively, the LSR may have multiple parallel paths branching out, with each path accounting for common delays. As long as each path never has outputs that overlap in time, the inputs may be spaced closer together. These implementations may utilize one DEMUX per path or may use a tree of DEMUXs to minimize logic, where the tree performs the functionality of the target and path delays described with respect to FIGS. 2A-2B.

Figure 3:
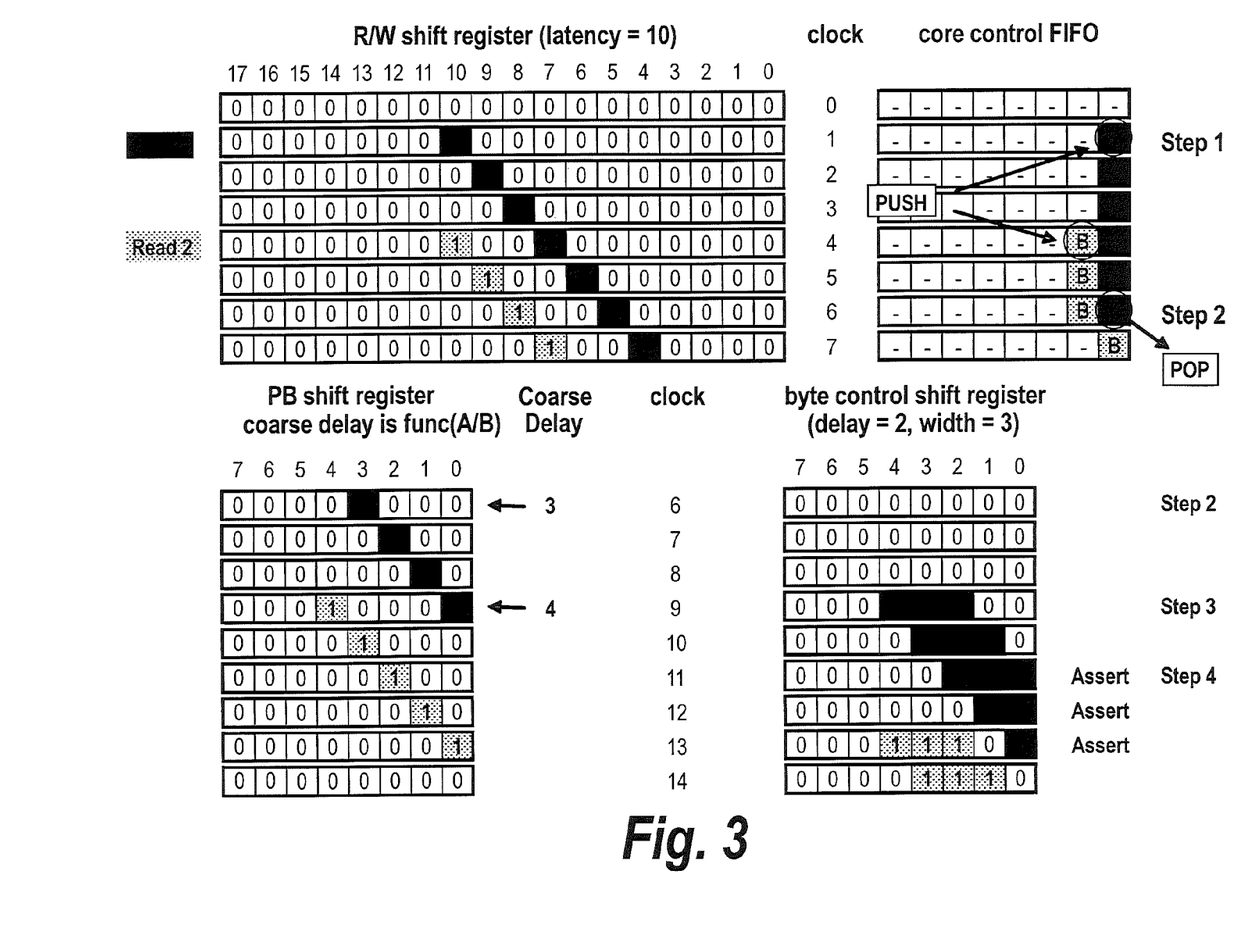
FIG. 3 is a schematic diagram that illustrates operations performed by timing controllers according to some embodiments of the invention.

FIG. 3 is a schematic diagram that illustrates operations performed by timing controllers according to some embodiments of the invention. As shown by FIG. 3, a sequence of read commands (Read1, Read2) and corresponding core control signals (A, B) may be received into a primary 18-bit shift register and pushed onto a core control FIFO during clock cycles 1 and 4. Delay element 10 within the shift register is set to a logic 1 value during cycles 1 and 4 based on a read latency (RL) of 10. As shown by the FIFO, a pop operation is performed to acquire the core control signals (e.g., command type, burst length and rank, etc.) associated with the first read command (Read1) at clock cycle 6, which corresponds to when the logic 1 value within the shift register has been moved to bit location 5 (e.g., RL-5). As shown by the logic 1 entries into the PB shift register at clock cycles 6 and 9, the core controls signals associated with the first and second read commands are used to specify corresponding rank-specific coarse delays of 3 (for Read1) and 4 (for Read2). As shown by movement of the logic 1 entries into bit position 0 of the PB shift register at clock cycles 9 and 13, each "byte" control shift register is loaded with a specific delay and pulse width indicator (shown as cycles wide) to generate the appropriate path-specific control signals. Thus, as illustrated beginning at clock cycle 11, a 3-cycle wide pulse is asserted during cycles 11-13.

Figure 4:
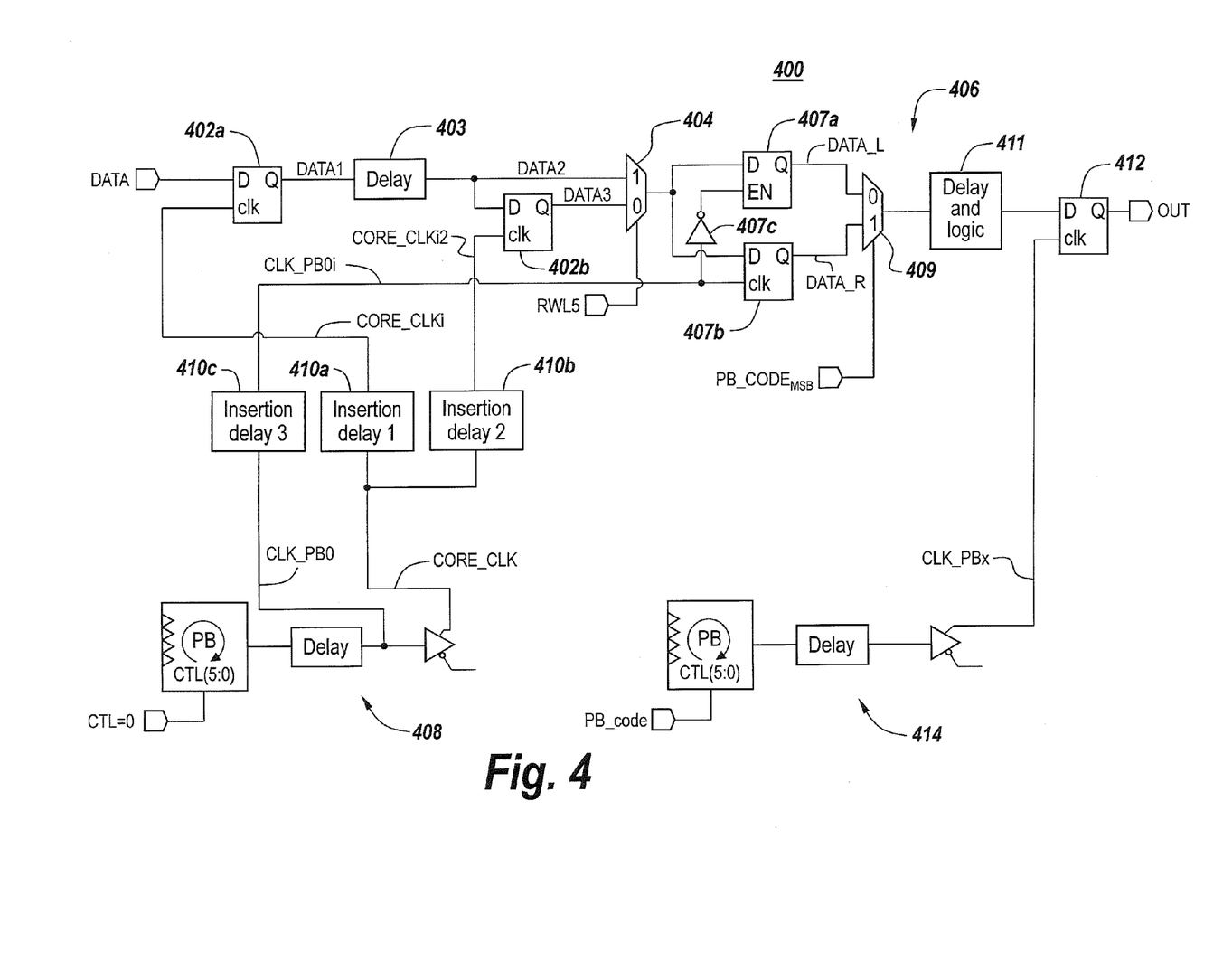
FIG. 4 is a block diagram of a multiple time domain synchronizer according to embodiments of the present invention.

Referring now to FIG. 4, a multiple time domain synchronizer 400 according to embodiments of the present invention is illustrated as including first and second serially-connected registers 402a, 402b. As shown, the first register 402a is configured to latch a first signal (DATA) in-sync with a first clock (CORE_CLKi), which is associated with a first time domain, and the second register 402b is configured to latch a second data signal (DATA2) derived from a signal (DATA1) output from the first register 402a in-sync with a second clock (CORE_CLKi2), which is phase-delayed relative to the first clock. This second signal is shown as passing through a delay device 403, which can be configured to provide a fixed delay to that data signal DATA1. A latency selection circuit 404 is also provided, which has a first input configured to receive a register output signal (DATA2) derived from the first register 402a and a second input configured to receive a register output signal (DATA3) from the second register 402b. The latency selection circuit 404, which is shown as a 2-input multiplexer, is configured to selectively pass one of the register output signals (DATA2 or DATA3) at the first and second inputs to an output in response to a latency control signal (RWL5). A synchronization circuit 406 is also provided, which is electrically coupled to an output of the latency selection circuit 404. The synchronization circuit 406, which includes first and second unequal timing paths therein, is responsive to a third clock (CLK_PB0i) that synchronizes capture of a register output signal selected by the latency selection circuit 404 and is responsive to a destination code ($PB\_CODE_{MSB}$) that selects, as active, one of the first and second unequal timing paths to be traversed by the captured register output signal. The synchronization circuit 406 may further include a destination register 412, which is configured to latch a signal derived from the traversal of the captured register output signal along the active one of the first and second unequal timing paths. This destination register 412 may be responsive to a fourth clock (CLK_PBx), which is associated with a second time domain that is phase-asynchronous relative to the first time domain. This fourth clock CLK_PBx may be provided by a clock generator 414, which is shown as including a phase-blender (PB) responsive to a six-bit phase blender code (PB_code), a delay device and a clock driver.

A core clock generator 408 is also provided, which is configured to generate a core clock (CORE_CLK). This core clock generator 408 may include a phase-blender (PB) responsive to a six-bit phase blender code (shown as CTL="0"), a delay device and a clock driver. First, second and third insertion delay devices 410a, 410b and 410c may also be provided, which are configured to provide the first clock (CORE_CLKi) as a first delayed version of the core clock (CORE_CLK), the second clock (CORE_CLKi2) as a second delayed version of the core clock (CORE_CLK) and the third clock (CLK_PB0i) as a delayed version of clock signal CLK_PB0. According to preferred aspects of the synchronizer 400, to achieve proper timing, a period of the core clock (CORE_CLK) minus a setup time of the second register 402b minus a delay provided by the data delay device 403 minus a difference between a delay provided by the first insertion delay device 410a and a delay provided by the second insertion delay device 410b is greater than zero.

The first timing path within the synchronization circuit 406 is illustrated as including a level sensitive latch 407a, which has an enable terminal (EN) responsive to an inverted version of the third clock (CLK_PB0i), which is generated by an inverter 407c. The second timing path is illustrated as including an output register 407b having a clock terminal responsive to the third clock (CLK_PB0i). The data input of the level sensitive latch 407a and a data input of the output register 407b are electrically coupled together. The synchronization circuit 406 further includes a second multiplexer 409 having a control terminal responsive to the destination code ($PB\_CODE_{MSB}$), a first input electrically coupled to an output of the level sensitive latch 407a and a second input electrically coupled to an output of the output register 407b. The destination register 412 has a data input terminal that receives a signal from a delay and logic circuit 411, which is responsive to the data signal (DATA_L or DATA_R) selected by the second multiplexer 409. This logic circuit 411 may, in some embodiments of the invention, be a combinational logic circuit.

Operation of the multiple time domain synchronizer 400 of FIG. 4 includes the generation of a data signal to be synchronized on the leading (e.g., rising) edge of the first clock CORE_CLKi, with a low latency path being selected when the latency control signal RWL5=1 and the second register 402b is bypassed. Because the low latency register-to-register path is longer, it becomes more difficult to meet timing requirements at higher operating frequencies. Thus, the latency control signal RWL5 can be set to "0" for high frequency operation when higher latencies are required to meet typical DDR3 specifications. As shown by FIG. 4, the level sensitive latch 407a closes when the third clock CLK_PB0i is high, however, selected data flows through the level sensitive latch 407a when CLK_PB0i is low. The output register 407b captures data when CLK_PB0i switches high. The signal selection operation performed by the second multiplexer 409 is controlled by the value of the destination phase blending code PB_code used by the destination clock generator 414. When the phase blending code PB_code has a value in a range from 0-31 (i.e., $PB\_CODE_{MSB}=0$), the multiplexer 409 selects the data from the level sensitive latch 407a. The signal that propagates through latch 407a must meet the setup time to destination register 412, which is clocked with a clock (CLK_PBx) having a phase 0-31. The worst cases for set up is when the destination clock CLK_PBx and the CLK_PB0i have the same phase of 0 and a half cycle after the level sensitive (i.e., "transparent") latch 407a opens. The signal that propagates through 407a must also meet the hold time to the destination register 412. The worst case for hold is when the destination phase is 31 and the destination clock CLK_PBx is $\frac{1}{64}^{th}$ of a clock cycle earlier than the falling edge of the clock CLK_PB0i, which is opening the latch 407a.

Alternatively, when the phase blending code PB_code has a value in a range from 32-63 (i.e., $PB\_CODE_{MSB}=1$) the multiplexer 409 selects the data from the output register 407b. The signal that propagates through 407b must meet the setup time to destination register 412 which is clocked with the destination clock CLK_PBx having a phase in a range from 32-63. Under these conditions, the worst case for setup is when the destination phase is 32 and the destination clock CLK_PBx is a half cycle after the register 407b opens. The signal that propagates through 407b must also meet the hold time to destination register 412. The worst case for hold is when the destination phase is 0 and the destination clock is $\frac{1}{64}^{th}$ of a clock cycle earlier than the rising edge of CLK_PB0i which is generating new data from the register 407b.

As will be understood by those skilled in the art, DDR3-compatible memory devices support read and write latencies of 5 cycles, but only at DDR800 rates (i.e., core clock frequencies of 400 MHz). Because the register-transfer level (RTL) circuitry generates a control signal on the $2^{nd}$ cycle after an input command, custom logic must receive the control signal on the $3^{rd}$ cycle. To achieve this low latency, the second register 402b is bypassed by setting the latency control signal RWL5=1. Alternatively, for higher operating speeds, the read and write latencies are above 5 and the second register 402b is not bypassed (RWL5=0). Accordingly, by registering the data on the rising edge of the second clock CORE_CLKi2, the timing paths to the destination register 412 and output register 407b are shorter because CORE_CLKi2 is associated with a lower insertion delay relative to CORE_CLKi. This characteristic allows the higher frequency of operation to meet timing constraints. Furthermore, the synchronizing operations performed by the elements 404, 407a-c, 409 and other elements in the embodiment of FIG. 4 may be used in combination with the embodiments of FIGS. 1A and 2A-2B. For example, the commands received by the primary delay chain 10 may undergo the synchronizing operations of FIG. 4 with the primary delay chain 10 being associated with the destination clock domain and synchronized with the clock CLK_PBx.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A multiple time domain synchronizer, comprising:
   first and second registers electrically connected in series, said first register configured to latch a first signal in-sync with a first clock associated with a first time domain and said second register configured to latch a second signal generated by an output of said first register in-sync with a second clock that is phase-delayed relative to the first clock;
   a latency selection circuit having a first input configured to receive a register output signal derived from said first register and a second input configured to receive a register output signal from said second register, said latency selection circuit configured to selectively pass one of the register output signals at the first and second inputs to an output thereof in response to a latency control signal; and
   a synchronization circuit electrically coupled to an output of said latency selection circuit and comprising first and second unequal timing paths therein, said synchronization circuit responsive to a third clock that synchronizes capture of a register output signal selected by said latency selection circuit and a destination code that selects one of the first and second unequal timing paths to be traversed by the captured register output signal as active.

2. The synchronizer of claim 1, further comprising a data delay device electrically coupled between the output of said first register and an input of said second register; and wherein the first and second inputs of said latency selection circuit are electrically coupled to the input and an output of said second register, respectively.

3. The synchronizer of claim 1, wherein said synchronization circuit further comprises a destination register configured to latch a signal derived from the traversal of the captured register output signal along the active one of the first and second unequal timing paths.

4. The synchronizer of claim 3, wherein the destination register is responsive to a fourth clock associated with a second time domain that is phase-asynchronous relative to the first time domain.

5. The synchronizer of claim 3, wherein the first timing path comprises a level sensitive latch having an enable terminal responsive to an inverted version of the third clock and the second timing path comprises an output register having a clock terminal responsive to the third clock.

6. The synchronizer of claim 5, wherein a data input of the level sensitive latch and a data input of the output register are electrically coupled together.

7. The synchronizer of claim 5, wherein said latency selection circuit comprises a first multiplexer having a control terminal responsive to the latency control signal; and wherein said synchronization circuit comprises a second multiplexer having a control terminal responsive to the destination code, a first input electrically coupled to an output of the level sensitive latch and a second input electrically coupled to an output of the output register.

8. The synchronizer of claim 1, further comprising:
   a core clock generator configured to generate a core clock; and
   first and second insertion delay devices configured to provide the first clock as a first delayed version of the core clock and the second clock as a second delayed version of the core clock, respectively.

9. The synchronizer of claim 8, further comprising a data delay device electrically coupled between the output of said first register and an input of said second register; and wherein a period of the core clock minus a setup time of the second register minus a delay provided by the data delay device minus a difference between a delay provided by the first insertion delay device and a delay provided by the second insertion delay device is greater than zero.

10. The synchronizer of claim 9, wherein the first, second and third clocks are in-sync with the core clock.

11. The synchronizer of claim 9, wherein the first and second inputs of said latency selection circuit are electrically coupled to the input and an output of said second register, respectively.

12. The synchronizer of claim 11, wherein said latency selection circuit comprises a first multiplexer having a control terminal responsive to the latency control signal.

13. A multiple time domain synchronizer, comprising:
a latency selection circuit having first and second inputs configured to receive first and second signals, respectively, said latency selection circuit configured to selectively pass one of the first and second signals to an output thereof in response to a latency control signal; and
a synchronization circuit electrically coupled to an output of said latency selection circuit and comprising first and second unequal timing paths therein, said synchronization circuit responsive to a first clock that synchronizes capture of the first or second signal selected by said latency selection circuit and a destination code that selects one of the first and second unequal timing paths to be traversed by the captured signal as active.

14. The synchronizer of claim 13, wherein said synchronization circuit further comprises a destination register configured to latch a signal derived from the traversal of the captured signal along the active one of the first and second unequal timing paths.

15. The synchronizer of claim 14, wherein the destination register is responsive to a second clock associated with a second time domain that is phase-asynchronous relative to the first time domain.

16. The synchronizer of claim 13, wherein the first timing path comprises a level sensitive latch having an enable terminal responsive to an inverted version of the first clock and the second timing path comprises an output register having a clock terminal responsive to the first clock.

17. The synchronizer of claim 16, wherein a data input of the level sensitive latch and a data input of the output register are electrically coupled together.

18. The synchronizer of claim 13, wherein said latency selection circuit comprises a first multiplexer having a control terminal responsive to the latency control signal; and wherein said synchronization circuit comprises a second multiplexer having a control terminal responsive to the destination code, a first input electrically coupled to an output of the level sensitive latch and a second input electrically coupled to an output of the output register.

\* \* \* \* \*